(12) United States Patent
Hipwell, Jr. et al.

(10) Patent No.: US 10,176,833 B1
(45) Date of Patent: Jan. 8, 2019

(54) HORIZONTAL CAVITY SURFACE EMITTING LASER INTEGRATION FEATURES FOR HEAT ASSISTED MAGNETIC RECORDING

(71) Applicant: Seagate Technology LLC, Cupertino, CA (US)

(72) Inventors: Roger L. Hipwell, Jr., Eden Prairie, MN (US); Scott Eugene Olson, Eagan, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/408,637

(22) Filed: Jan. 18, 2017

Related U.S. Application Data

(60) Provisional application No. 62/286,181, filed on Jan. 22, 2016, provisional application No. 62/286,185, filed on Jan. 22, 2016.

(51) Int. Cl.
| | | |
|---|---|---|
| *G11B 11/00* | (2006.01) | |
| *G11B 5/48* | (2006.01) | |
| *H01S 5/10* | (2006.01) | |
| *H01S 5/18* | (2006.01) | |
| *H01S 5/022* | (2006.01) | |
| *H01S 5/024* | (2006.01) | |
| *G11B 5/00* | (2006.01) | |
| *G11B 5/60* | (2006.01) | |

(52) U.S. Cl.
CPC .......... *G11B 5/4866* (2013.01); *G11B 5/4826* (2013.01); *H01S 5/02272* (2013.01); *H01S 5/02469* (2013.01); *H01S 5/1082* (2013.01); *H01S 5/18* (2013.01); *G11B 5/6088* (2013.01); *G11B 2005/0021* (2013.01)

(58) Field of Classification Search
None
See application file for complete search history.

(56) References Cited

U.S. PATENT DOCUMENTS

| | | | |
|---|---|---|---|
| 5,357,536 A | 10/1994 | Andrews | |
| 7,580,602 B2 | 8/2009 | Itagi et al. | |
| 7,957,085 B2 | 6/2011 | Tanaka et al. | |
| 8,243,561 B2 | 8/2012 | Matsumoto | |
| 8,270,262 B2 | 9/2012 | Naniwa et al. | |
| 8,300,503 B2 | 10/2012 | Arai et al. | |
| 8,345,517 B2 | 1/2013 | Hurley et al. | |
| 8,379,495 B2 * | 2/2013 | Boone, Jr. .............. | G11B 5/314 369/13.32 |
| 8,456,969 B1 | 6/2013 | Mooney et al. | |
| 8,477,570 B2 | 7/2013 | Arai et al. | |
| 8,488,435 B2 | 7/2013 | Snyder | |

(Continued)

OTHER PUBLICATIONS

U.S. Appl. No. 15/408,646.

*Primary Examiner* — Tan X Dinh
(74) *Attorney, Agent, or Firm* — Hollingsworth Davis, LLC

(57) ABSTRACT

A folded lasing cavity comprises at least one bend. The folded lasing cavity is disposed on and configured to emit light along a substrate-parallel plane. An etched facet is on an emitting end of the folded lasing cavity and an etched mirror is on another end of the folding lasing cavity. An etched shaping mirror redirects light received from the etched facet in a direction normal to the substrate-parallel plane.

9 Claims, 24 Drawing Sheets

(56) References Cited

U.S. PATENT DOCUMENTS

| | | |
|---|---|---|
| 8,593,914 B2 | 11/2013 | Wang et al. |
| 8,611,193 B2 | 12/2013 | Hipwell et al. |
| 8,873,348 B2 | 10/2014 | Hipwell et al. |
| 8,873,903 B2 | 10/2014 | Wessel |
| 9,202,489 B2 * | 12/2015 | Gokemeijer ......... G11B 5/4866 369/13.33 |
| 9,336,801 B2 | 5/2016 | Smith |
| 9,489,967 B2 | 11/2016 | Goulakov et al. |
| 9,606,308 B2 | 3/2017 | Barwicz et al. |
| 9,830,937 B1 * | 11/2017 | Hipwell, Jr. ......... G11B 5/4826 369/13.33 |
| 2002/0085612 A1 * | 7/2002 | Ju ..................... B82Y 10/00 372/102 |
| 2003/0007538 A1 * | 1/2003 | Jiang ................. H01S 5/026 372/75 |
| 2003/0185266 A1 | 10/2003 | Henrichs |
| 2008/0291951 A1 * | 11/2008 | Konttinen ........... G02B 5/1809 372/21 |
| 2011/0266469 A1 | 11/2011 | Goulakov et al. |
| 2012/0099407 A1 * | 4/2012 | Hipwell ............. G11B 5/105 369/13.32 |
| 2013/0142478 A1 | 6/2013 | Sluzewski et al. |
| 2013/0279311 A1 | 10/2013 | Hurley et al. |
| 2013/0279312 A1 * | 10/2013 | Hurley ............... G11B 5/105 369/13.33 |
| 2015/0049595 A1 * | 2/2015 | Smith ................ G11B 5/314 369/13.33 |
| 2017/0092309 A1 | 3/2017 | Goulakov |

* cited by examiner

HORIZONTAL CAVITY SURFACE EMITTING LASER INTEGRATION FEATURES FOR HEAT ASSISTED MAGNETIC RECORDING

RELATED PATENT DOCUMENTS

This application claims the benefit of Provisional Patent Application Ser. Nos. 62/286,181 and 62/286,185 filed on Jan. 22, 2016, to which priority is claimed pursuant to 35 U.S.C. § 119(e), and which are incorporated herein by reference in their entirety.

SUMMARY

Embodiments described herein are directed to a folded lasing cavity comprising at least one bend, the folded lasing cavity disposed on and configured to emit light along a substrate-parallel plane. An etched facet is on an emitting end of the folded lasing cavity and an etched mirror is on another end of the folding lasing cavity. An etched shaping mirror redirects light received from the etched facet in a direction normal to the substrate-parallel plane.

Embodiments described herein are directed to a slider body with a mounting surface comprising an input to an optical coupling path integrated into the slider body. A bonding material that at least partially surrounds the input. The bonding material creates an at least partially sealed region containing an output of a laser, a mirror, and an input coupler on the slider body. The sealed region prevents the entry of particles into a region between the input coupler, the mirror, and the output of the laser.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part of the description hereof and in which are shown by way of illustration of several specific embodiments. It is to be understood that other embodiments are contemplated and may be made without departing from the scope of the present invention. The following detailed description, therefore, is not to be taken in a limiting sense.

The present disclosure is generally related to heat-assisted magnetic recording (HAMR), also referred to as energy-assisted magnetic recording (EAMR), thermally-assisted recording (TAR), thermally-assisted magnetic recording (TAMR), etc. In a HAMR read/write head, a near-field transducer concentrates optical energy into a tiny optical spot in a recording layer, which raises the media temperature locally. The hotspot reduces the writing magnetic field required for high-density recording. This disclosure describes aspects of integrating a Horizontal Cavity Surface Emitting Laser (HCSEL) into a HAMR read/write head being developed for hard disc drives (HDDs). It is to be understood that "laser" may be used interchangeably with "HCSEL" in this disclosure.

Figure 1:
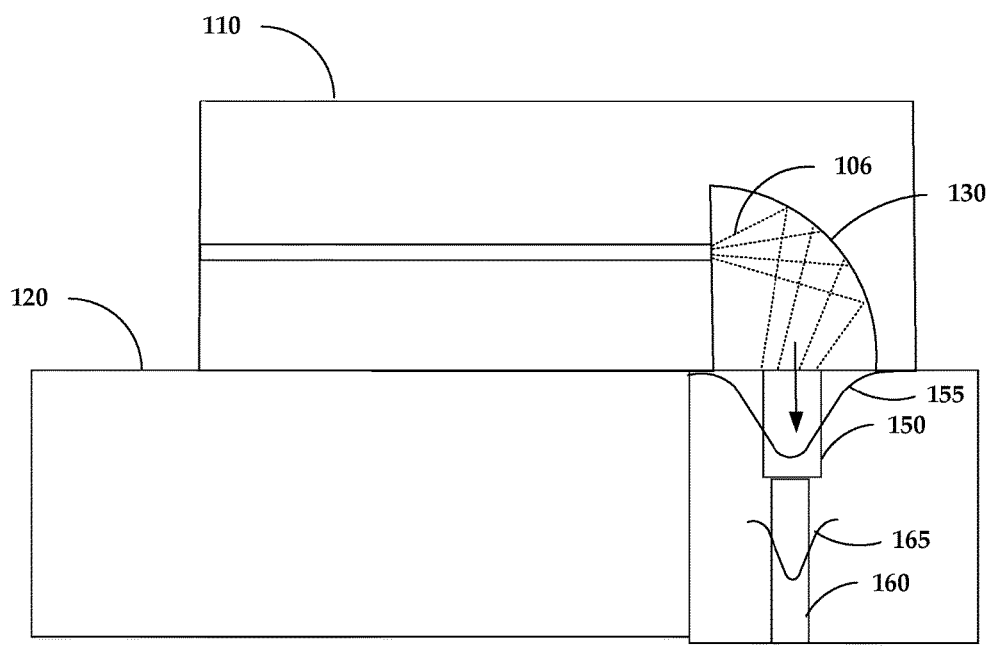
FIG. 1 illustrates a concept image of a HCSEL that is mounted on a read/write head or slider in accordance with various embodiments described herein.

FIG. 1 illustrates a concept image of a HCSEL that is mounted on a read/write head or slider. For this disclosure, the terms "read/write head", "head", and "slider" will be used interchangeably and are to represent a read/write head for hard disk drives. The HCSEL laser diode 110 is mounted upon the back slide of the slider 120. The HCSEL 110 emits light 106 that is reflected into an optical input coupler 150 by an etched shaping mirror 130. The light profile 155 is shown as it enters the slider 120 from the HCSEL 110. The optical input coupler 150 couples light from the HCSEL 110 into the waveguide 160. The waveguide is designed to concentrate the light into an optical spot on the media as shown by light profile 165.

Figure 2A:
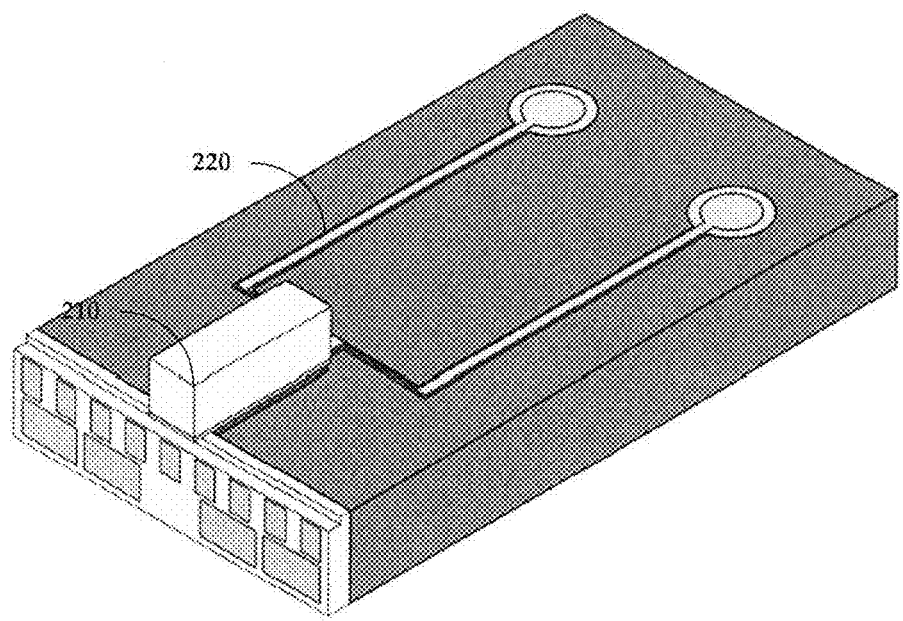
FIGS. 2A and 2B show a different view of the slider and the HCSEL in accordance with various embodiments described herein.
Figure 2B:
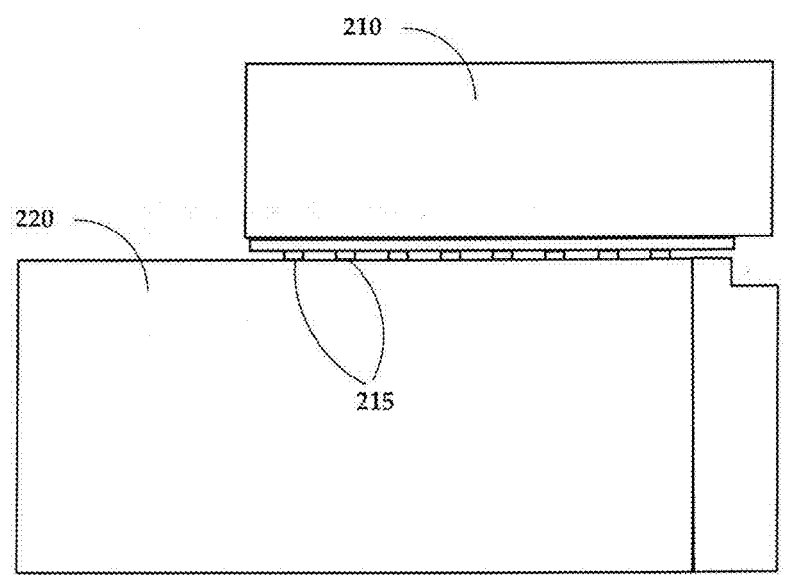

FIGS. 2A and 2B show a different view of a slider 220 and HCSEL 210. A plurality of bond pads 215 may be disposed on the HCSEL 210 and/or the slider 220. A bonding material such as solder, for example, may be disposed on the bonding pads. The bond pads 215 may be used for various purposes. For example, the bond pads 215 may be used for mechanical attachment, electrical connection, thermal connection, and/or alignment of the HCSEL 210 with the slider 220. In some cases, a reflow of the bonding material induces relative movement between the HCSEL 210 and the slider 220. This relative movement may facilitate alignment of features of the HCSEL 210 with features of the slider 220.

Figure 3A:
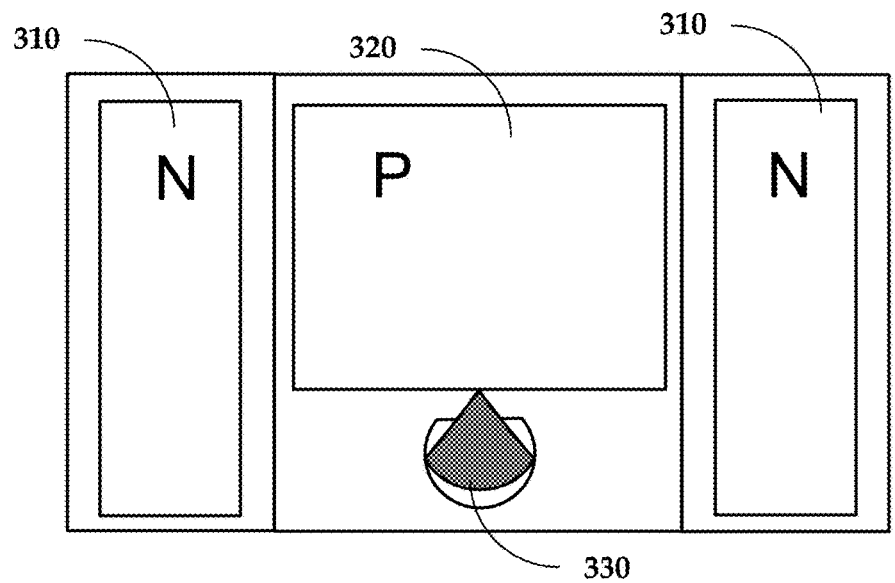
FIGS. 3A and 3B are a close-up view of bond pads on the HCSEL in accordance with embodiments described herein.
Figure 3B:
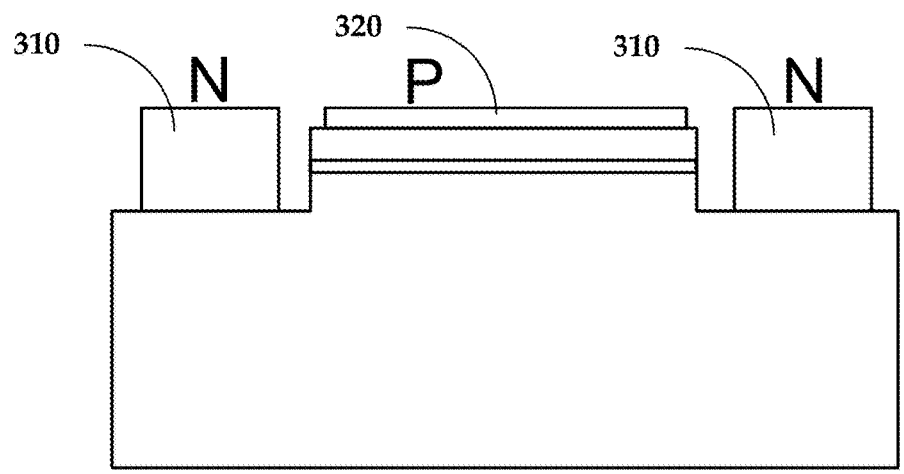

FIGS. 3A and 3B are a close-up view of bond pads on the HCSEL in accordance with embodiments described herein. A bond pad array is disposed on a single side of the HCSEL that faces the slider. The bond pad array includes N laser electrode material (cathode) 310 alternated with P laser electrode material (anode) 320 on the single side of the HCSEL. Laser light emerges from laser cavity under the P-electrode into mirror 330 which serve to both shape the emerging light and re-direct the direction (for example, perpendicular to the laser cavity).

Figure 4A:
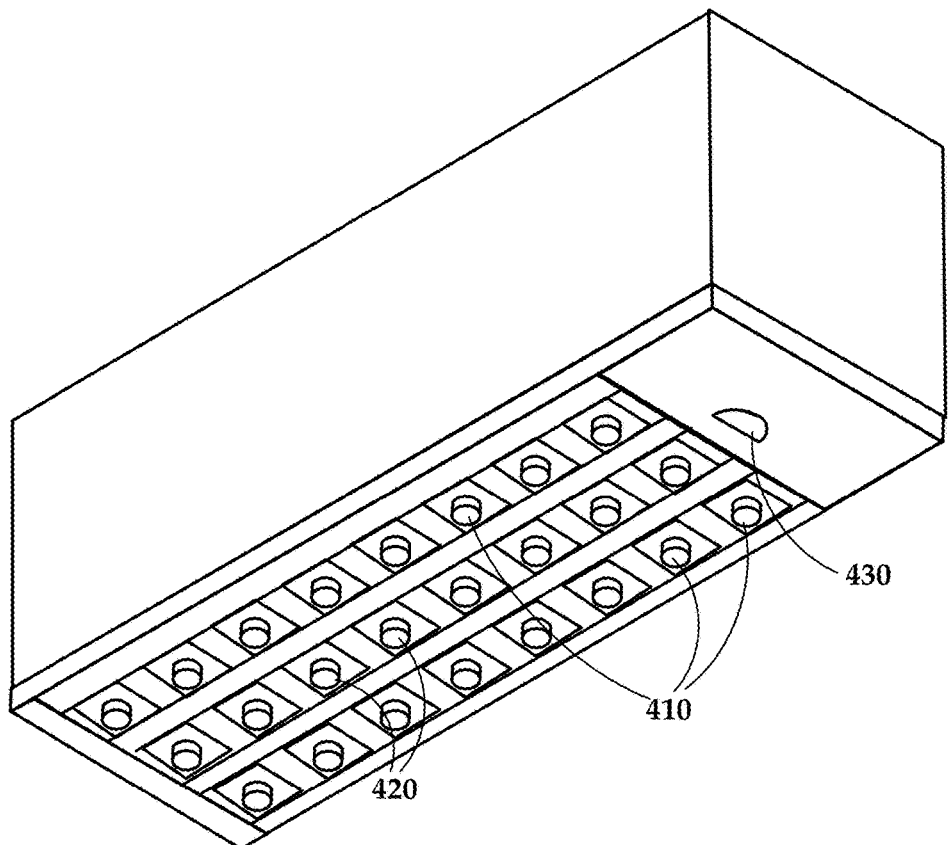
FIGS. 4A and 4B show illustrates other views of the HCSEL having a bond pad array having N laser electrodes alternated with P laser electrodes in accordance with various embodiments described herein.
Figure 4B:
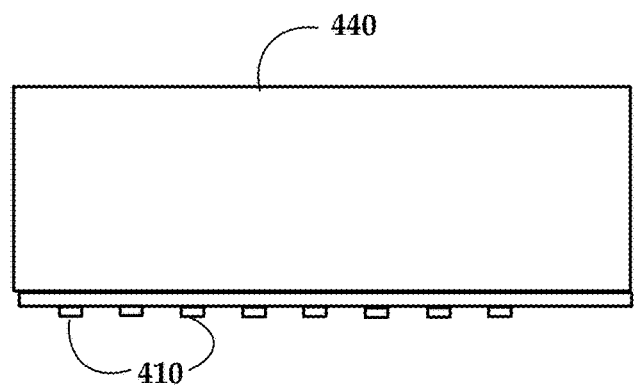

FIG. 4A illustrates another view of the HCSEL with a bond pad array having N laser electrodes 420 alternated with P laser electrodes 410 an accordance with various embodiments. Light is output at facet 430 where the shaping mirror helps to couple the laser light into the optical input coupler of the slider. FIG. 4B illustrates a side view of the HCSEL 440 having bond pads 415 on a side of the HCSEL 440 that faces the slider.

With a standard edge-emitting laser diode, light is emitting out of the laser cavity parallel to the cavity layer and with diverging beam characteristics. With an HCSEL, the orientation of the light source is redirected (compared to an edge-emitting laser) using a reflecting mirror and as a result, the location of the surfaces that are precisely defined or referenced on the laser and the slider are also changed. In addition, in some HCSEL fabrication methods, the mirror can be shaped in manner that not only redirects the light but also shapes beam using principles of reflective optics. In some cases, defining a method to align the output position of the laser to the optical input coupler in such a way that manufacturing tolerances or realistic assembly tools can achieve the acceptable alignment tolerance. (e.g., microns or submicron) may be desirable. One method to facilitate alignment of the HCSEL with the slider may utilize reference features located on one or both of the HCSEL and the slider. The reference features may be used to define a reference surface and/or as a physical stopper to aide in the alignment of the HCSEL with the slider.

Figure 5A:
FIGS. 5A-5F illustrate a process for creating reference features in an HCSEL system in accordance with various embodiments described herein.
Figure 5B:
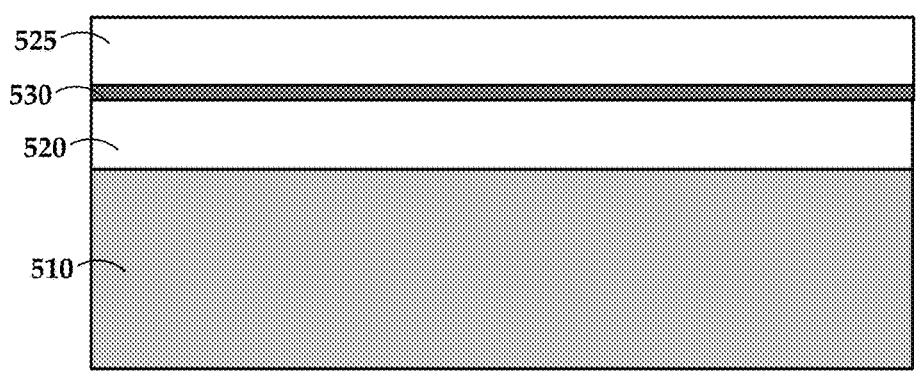
Figure 5C:
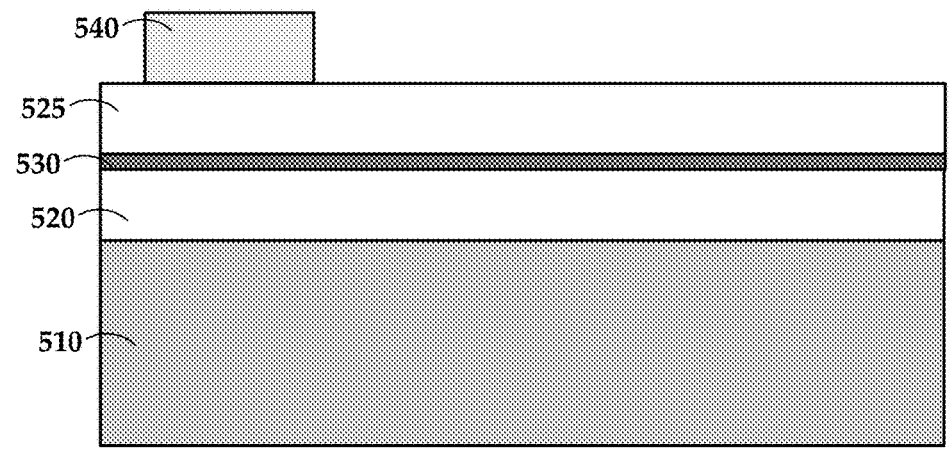

The fabrication of stoppers may pose some challenges as a desired tolerance may be very small and therefore the thickness variation of the process may also need to be small for precise alignment. FIGS. 5A-5F illustrate a process for creating reference features in an HCSEL system. A basecoat, cladding, and other read/write layers 520 are fabricated on a substrate 510. According to one implementation, the substrate comprises AlTiC. Optical coupler and/or core layers 530 are deposited and/or patterned on the other layers 520. The layers may be fabricated using thin-film deposition, photolithography, etching, and/or using a lift-off process, for example. Using these techniques allows for deposition thickness control of the layers. The control of the deposition thickness facilitates a precise position reference with respect to other components. Precise thickness may be desirable for alignment and/or positioning of the components. A top cladding layer 525 is deposited on the core layers 530 as shown in FIG. 5B. A sacrificial layer 540 is deposited on the top cladding layer 525 as shown in FIG. 5C. In some cases, the sacrificial layer material is chosen such that it can be selectively wet etched with respect to the other materials surrounding it. For example, the sacrificial layer 540 may comprise copper. The sacrificial layer 540 may be patterned such that it is only in a desired precise region that will end up exposed on the top side of the slider. The patterning process may be done by an etching, a plating, and/or a lift-off process, for example. In some cases, certain related processing or release-etch steps can utilize a non-precise mask (i.e. a photolithography masks that may have significantly less alignment requirements than the defining sacrificial feature) For example, in some embodiments, a protective mask could be patterned on other regions of the slider during the selective sacrificial etch but be recessed by several microns from the edge of the sacrificial feature to be removed. This may allow exposure of the sacrificial material by the etchants while generally protecting the areas not to be etched if the material surrounding the sacrificial material is highly selective to the sacrificial etchant. An example of this is shown in FIG. 7C as described below.

Figure 5D:
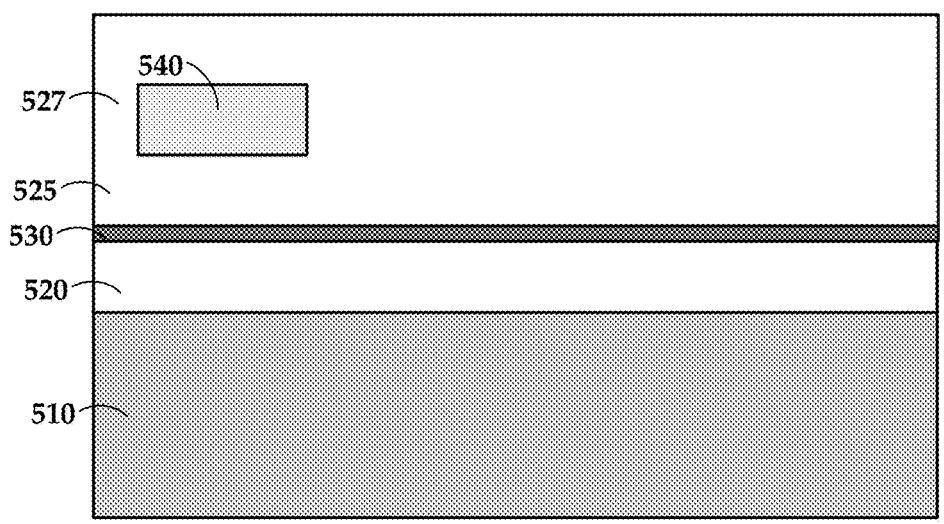
Figure 5E:
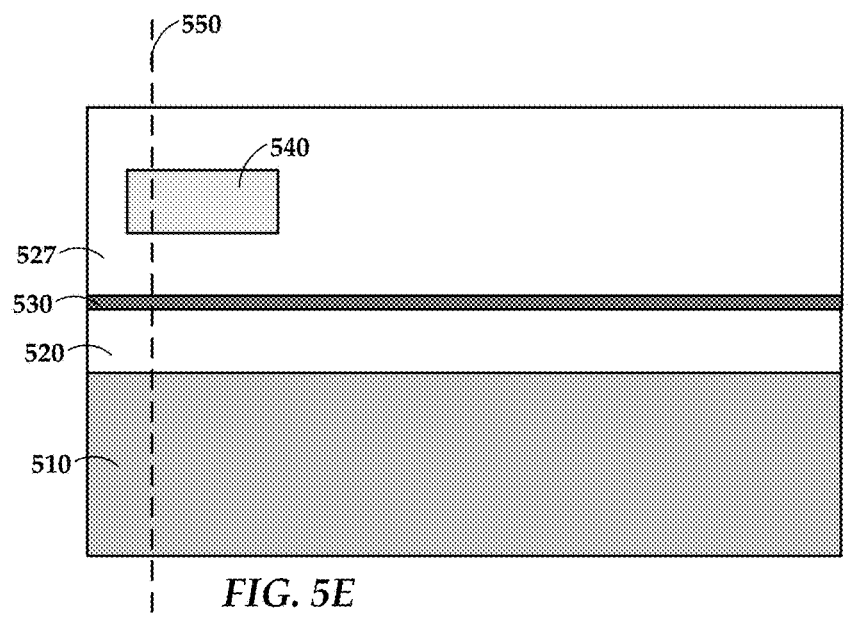
Figure 5F:
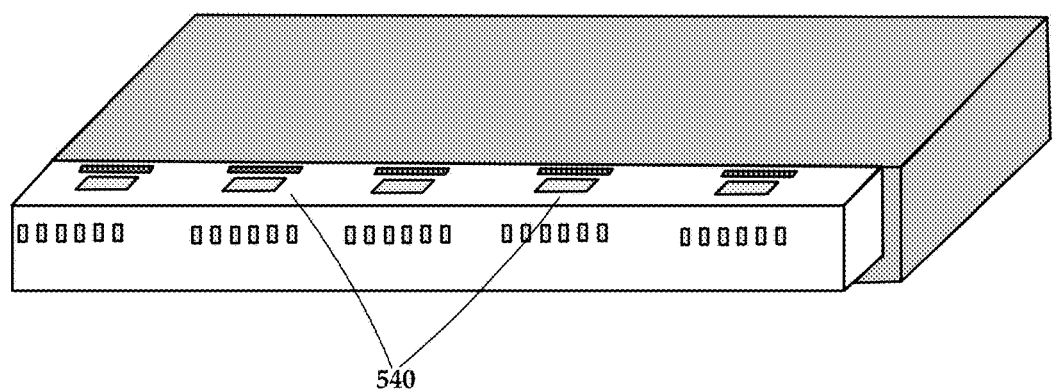

The sacrificial layer 540 is encapsulated and/or planarized as shown in FIG. 5D with a cladding material 527. The cladding material 527 used to encapsulate the sacrificial layer 540 may be the same or different cladding material as that of the top cladding layer 525. In some cases, the cladding material used to encapsulate the sacrificial layer 540 comprises $Al_2O_5$. The sacrificial layer 540 is patterned such that it is in a desired location that will end up exposed on the top side of the slider. The sacrificial layer 540 may be exposed on the top of the slider near the optical input coupler by implementing a bar slice along the dotted line 550 shown in FIG. 5E. FIG. 5F shows a plurality of exposed sacrificial layers 540. At some point in the process, the sacrificial layer 540 is removed by using a wet etch process, for example. The surface that is left behind after the removal of the sacrificial layer 540 allows for very precise position control with respect to the optical input coupler and the HCSEL.

Figure 6A:
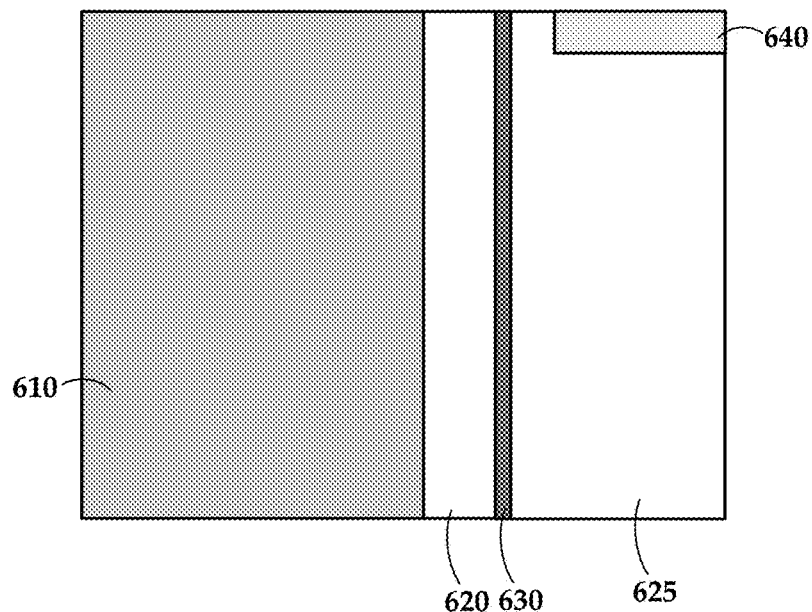
FIGS. 6A-6F show a process utilizing a mask to create a downtrack reference feature in accordance with various embodiments described herein.
Figure 6B:
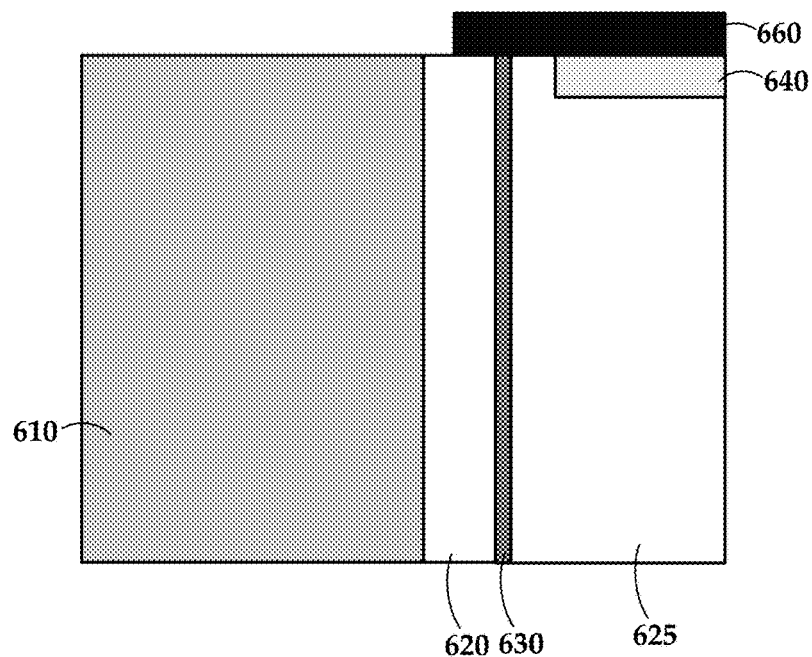
Figure 6C:
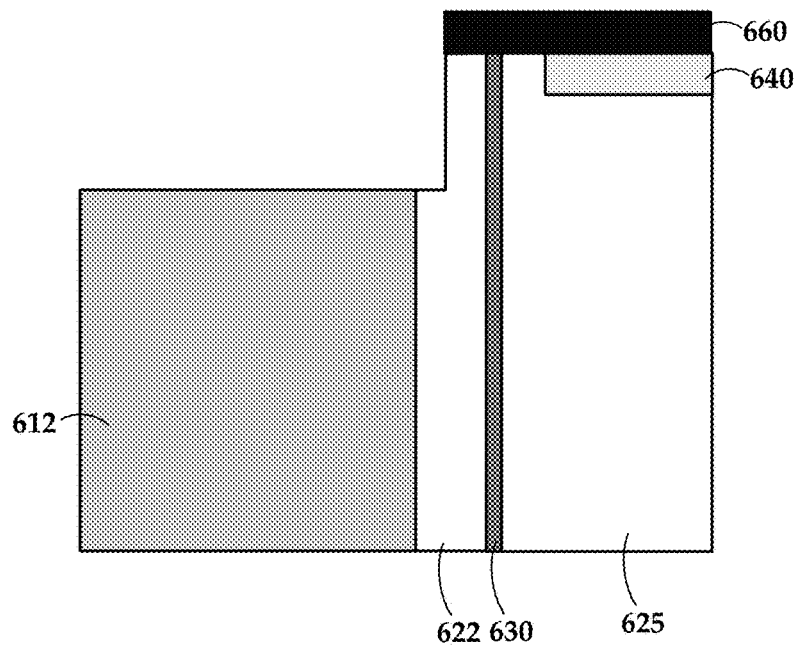
Figure 6D:
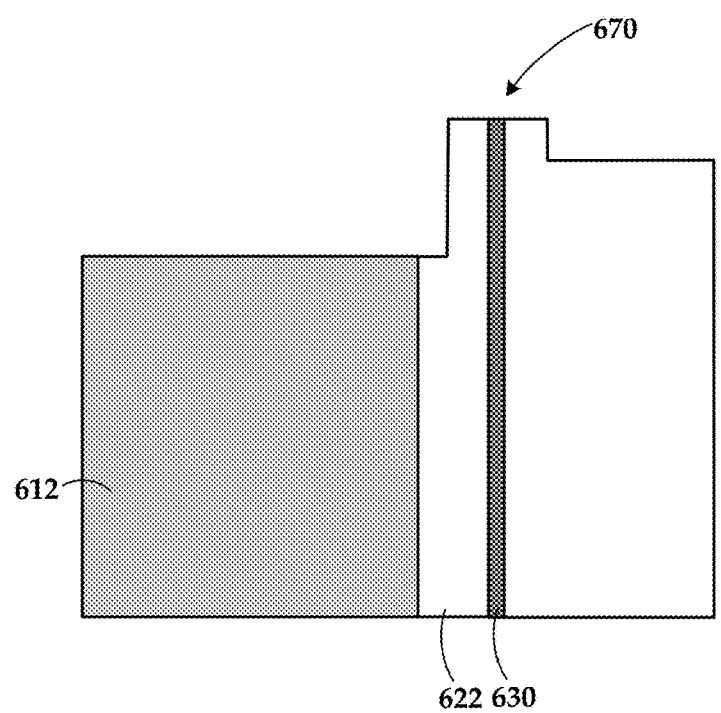

According to various implementations, a mask layer is used to create a down-track reference feature. FIGS. 6A-6F show a process utilizing a mask to create a downtrack reference feature in accordance with various embodiments described herein. Similar to FIGS. 5A-5F, a basecoat, cladding, and other read/write layers 620 are fabricated on a substrate 610. Optical input coupler and/or core layers 630 are deposited and/or patterned on the other layers 620. A top cladding 625 is deposited on the core layers 630. A sacrificial layer 640 is deposited on the top cladding layer 625. It may be desirable to etch away a portion of the slider body 612 to enable interaction between the reference feature 670 in the slider with the reference feature 689 on the laser; this avoids the need for laser reference feature 689 to be protruding a long distance. In this embodiment, a mask layer 660 is deposited on the sacrificial layer 640 and at least a portion of the top cladding layer 625, the core layer 630, and the cladding layers 620 as shown in FIG. 6B. An etching process is performed and portions of the substrate 612 and the basecoat, cladding and/or other read/write layers 622 that are not covered by the mask layer 660 are etched and/or otherwise removed as shown in FIG. 6C. According to various implementations, the etch is timed such that only a desired portion of the system that is not covered by the mask layer is etched. The mask layer 660 and the sacrificial layer 640 are then removed leaving behind a reference feature 670.

Figure 6E:
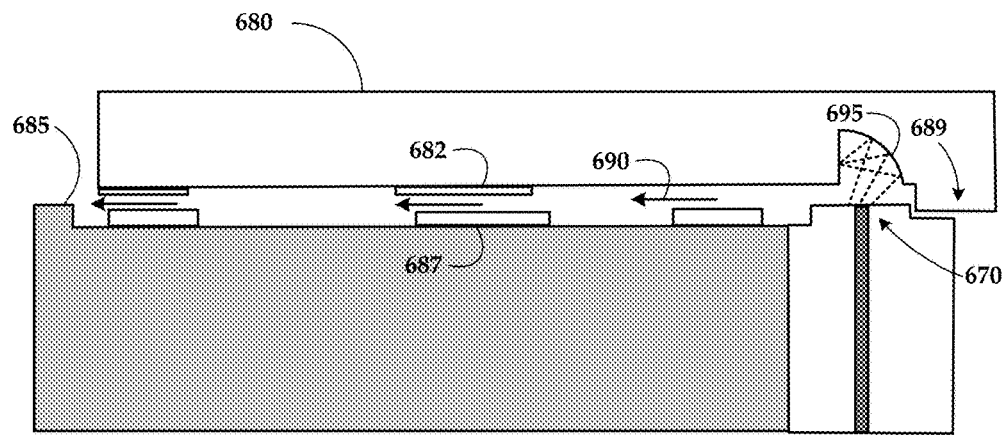
Figure 6F:
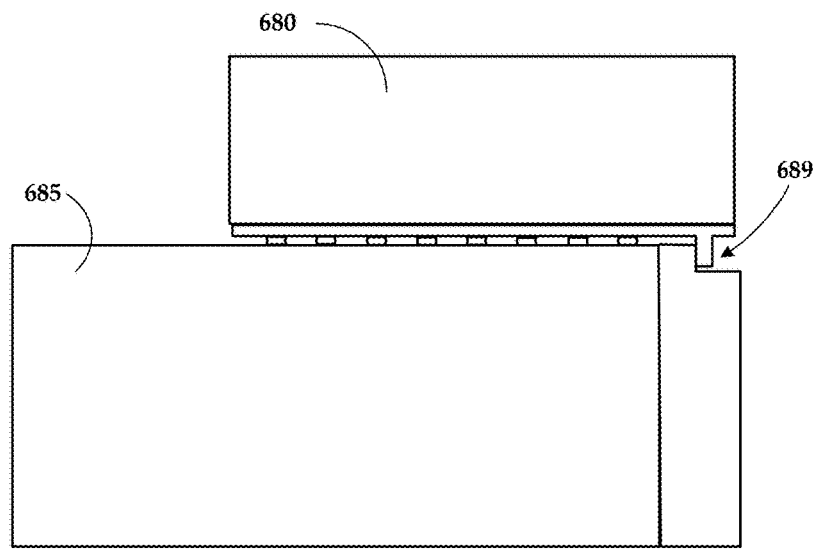

FIG. 6E shows a HCSEL system with a reference feature 670 defined with respect to the laser emission and/or focus point from the mirror 695. This can be further combined with solder self-alignment pads 682, 687 disposed on the HCSEL 680 and/or the slider 685. The solder self-alignment pads 682, 687 may help with alignment by using a reflow process and surface tension forces to self-align the laser into a desired cross-track and downtrack alignment. The HCSEL 680 and/or the slider 685 moves along the arrows 690 during the reflow process to obtain precise alignment. In some cases, the alignment pads on the HCSEL 682 are offset from the pads on the slider 687. The amount that the pads are offset may be chosen to cause surface forces to push the reference surfaces into contact before the features are self-centered. Having the pads offset may allow for more flexibility in the manufacturing tolerance of the device as the precise alignment can be achieved through a solder reflow process as described above. In some cases, the down-track alignment can be precisely defined by the HCSEL reference surface 689 physically hitting against the reference surface 670 that was created by removal of the sacrificial material. FIG. 6F shows the reference feature 689 of the HCSEL 680 physically preventing the slider 685 and/or the HCSEL 680 from shifting past the reference feature 689.

Figure 7A:
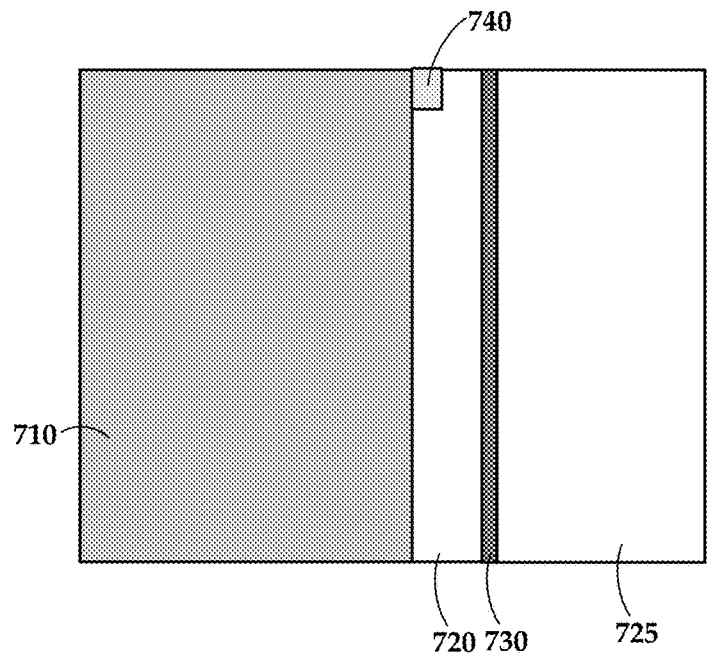
FIGS. 7A-7E show another process for creating reference patterns to align the HCSEL with the slider in accordance with various embodiments described herein.
Figure 7B:
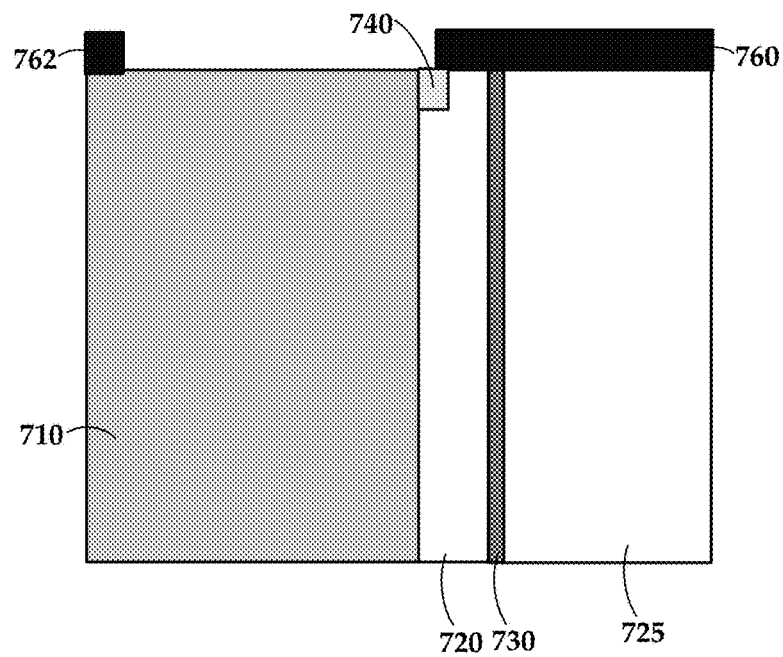
Figure 7C:
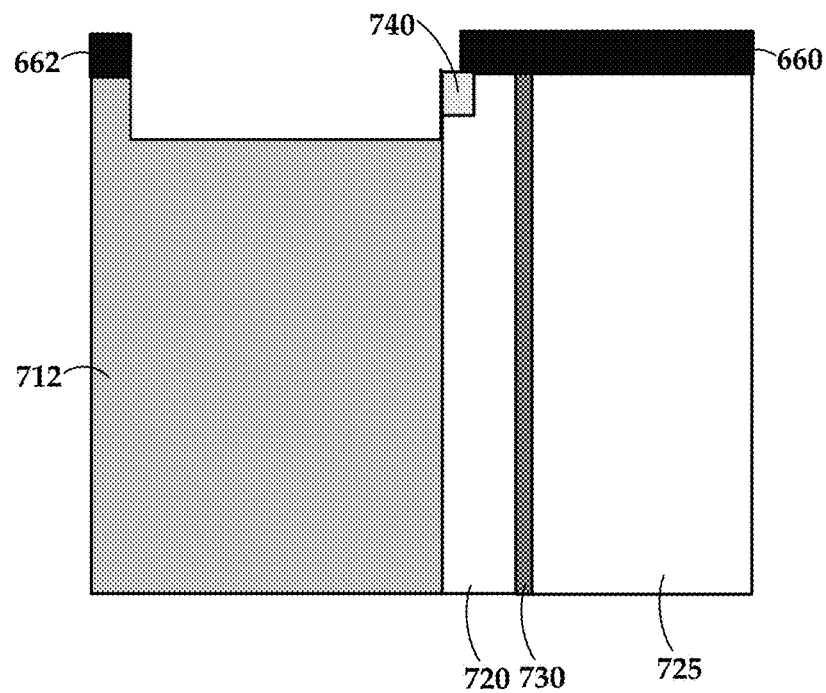
Figure 7D:
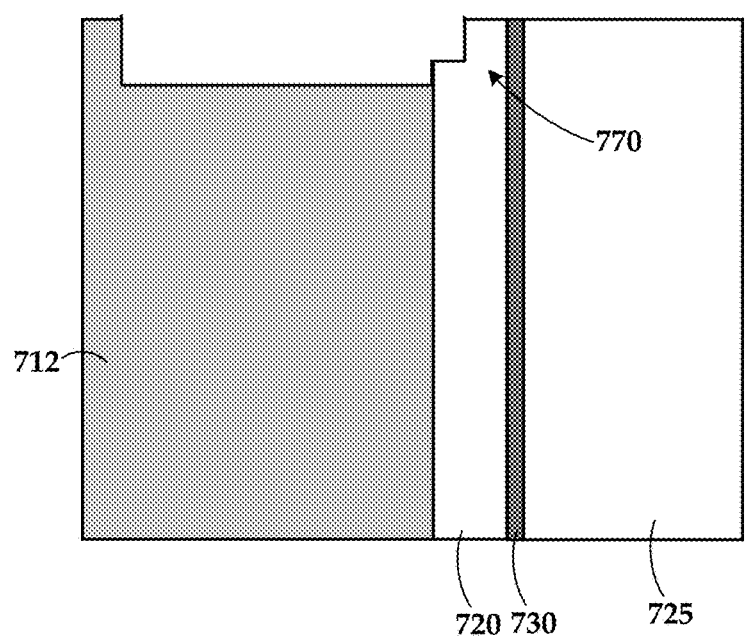

FIGS. 7A-7E show another process for creating reference patterns to align the HCSEL with the slider. The fundamental approach for creating a reference surface 770 with precise control to the input coupler is the same, but this embodiment positions the interaction with laser reference feature on the other side of the waveguide. In this process, a basecoat, cladding, and other read/write layers 720 are fabricated on a substrate 710. Optical input coupler and/or core layers 730 are deposited and/or patterned on the other layers 720. A top cladding 725 is deposited on the core layers 730. A sacrificial layer 740 is deposited between the substrate 710 and the optical input coupler and/or core layers 720 as shown in FIG. 7A. A first mask layer 762 is deposited on at least a portion of the substrate and a second mask layer 760 is deposited on at least a portion of the sacrificial layer 740 and at least a portion of the top cladding layer 725, the core layer 730, and the basecoat, cladding layers and/or other write layers 720 as shown in FIG. 7B. An etching process is performed and portions of the substrate 712 are removed that are not covered by the first mask layer 662 and/or the second mask layer 660 as shown in FIG. 7C. The sacrificial layer 740 is then removed to create a system having the reference feature 770 as shown in FIG. 7D.

Figure 7E:
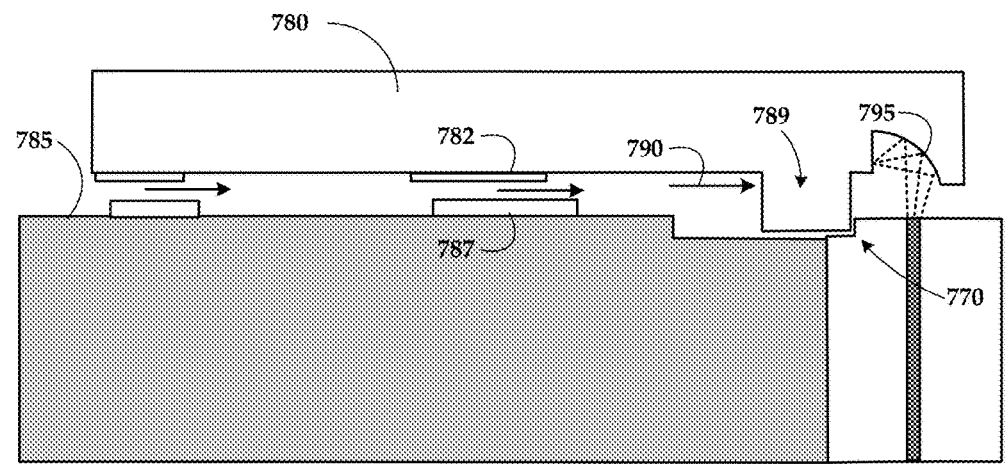

FIG. 7E shows a HCSEL system with a reference feature 770 defined with respect to the laser emission and/or focus point from the mirror 795. This can be further combined with solder self-alignment pads 782, 787 disposed on the HCSEL 780 and/or the slider 785. Similarly to the earlier discussion, the solder self-alignment pads 782, 787 may help with alignment by using a reflow process that uses surface tension forces to self-align the laser 780 into a desired cross-track and downtrack alignment. The HCSEL 780 and/or the slider 785 moves along the arrows 790 during the reflow process to obtain precise alignment. The HCSEL 780 also has a reference feature 789 that, combined with the reference feature 770 on the slider 785 mechanically prevents the slider 785 and/or the HCSEL 780 from shifting beyond the reference feature 770.

Figure 8:
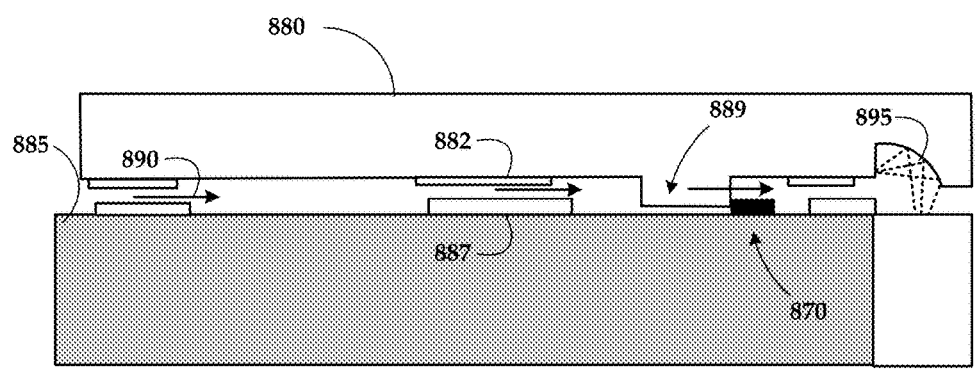
FIG. 8 illustrates another way of providing a mechanical alignment stop for the system in accordance with various embodiments described herein.

FIG. 8 illustrates another way of providing a mechanical stop for the system. The key difference in this embodiment is the use of an additive reference feature 870 that relies on precise photolithography positioning during a slider backside process. The HCSEL 880 has a reference feature 889 formed on the surface facing the slider 885. A mechanical reference feature 870 is directly patterned on the slider 885 surface facing the HCSEL 880. In some cases, the mechanical reference feature 870 is patterned on the slider using a precision lithography process. As in previous figures, the combination of the reference feature 889 of the HCSEL 880 and the reference features 870 of the slider 885 mechanically allows for precise alignment of the system. The solder self-alignment pads 882, 887 may help with alignment by using a reflow process that uses surface tension forces to self-align the laser into a desired cross-track and downtrack alignment as at least one of the HCSEL 880 and the slider moves along arrows 890. The alignment system described in FIG. 8 shows alignment of the laser emission and/or focus point from the mirror 895 with the optical input coupler of the slider 885.

Figure 9A:
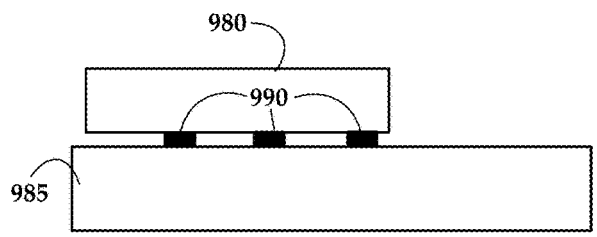
FIGS. 9A-9D shows various configurations that provide crosstrack, downtrack, and/or vertical alignment in accordance with various embodiments described herein.
Figure 9B:
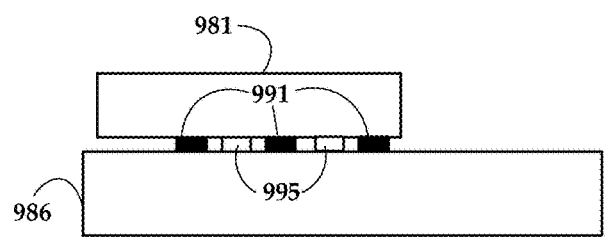

While FIGS. 5A-8 show various ways to provide precise alignment of the system, other additional or alternative ways exist to provide precise alignment. FIGS. 9A-9D shows various configurations that provide crosstrack, downtrack, and/or vertical alignment that can be used in addition to or as an alternative to the systems shown in FIGS. 5A-8. In some cases, no reference features are used and the system relies solely on the solder self-alignment process described above. FIG. 9A illustrates an example in which the solder self-alignment pads 990 disposed on the slider 985 and/or the HCSEL 980 and are used to provide precise alignment of the slider 985 with the HCSEL 980. FIG. 9B shows an example in which one or more vertical stoppers 995 in-between solder self-alignment pads 991 disposed on the slider 986 and/or the HCSEL 981 are used to provide precise alignment of the slider 986 with the HCSEL 981.

Figure 9C:
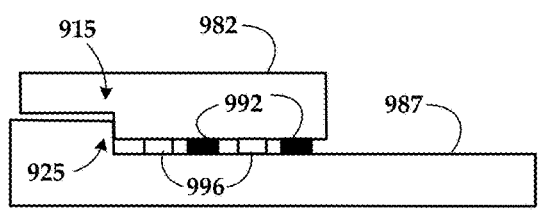
Figure 9D:
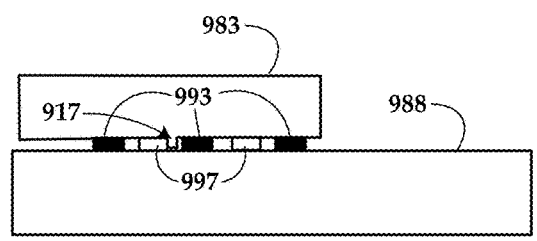

In some cases, reference features on one or both of the HCSEL and the slider are used in combination or instead of the vertical stoppers. FIG. 9C shows an example in which a reference feature 915 of the HCSEL and a reference feature 925 of the slider is used in combination with vertical stoppers 996 in-between solder self-alignment pads 992 disposed on the slider 987 and/or the HCSEL 982 are used to provide precise alignment of the slider 987 with the HCSEL 982. FIG. 9D illustrates an example in which a reference feature 917 of the HCSEL is used in combination with vertical stoppers 997 in-between solder self-alignment pads 993 disposed on the slider 988 and/or the HCSEL 983 are used to provide precise alignment of the slider 988 with the HCSEL 983. In the example shown in FIG. 9D, the reference feature 917 of the HCSEL is disposed between a solder self-alignment pad 993 and a vertical stopper 997. The combination of the vertical stopper 997 and the reference feature 917 may provide for a mechanical stop to aide in alignment of the system. The vertical stoppers described in 9B-9D may provide precise vertical alignment for the system. In a system lacking vertical stoppers, the height of the system may be controlled by control of the solder volume. In some cases, a HCSEL system may have a laser that has a tolerance to account for a system lacking in vertical stoppers.

Figure 10A:
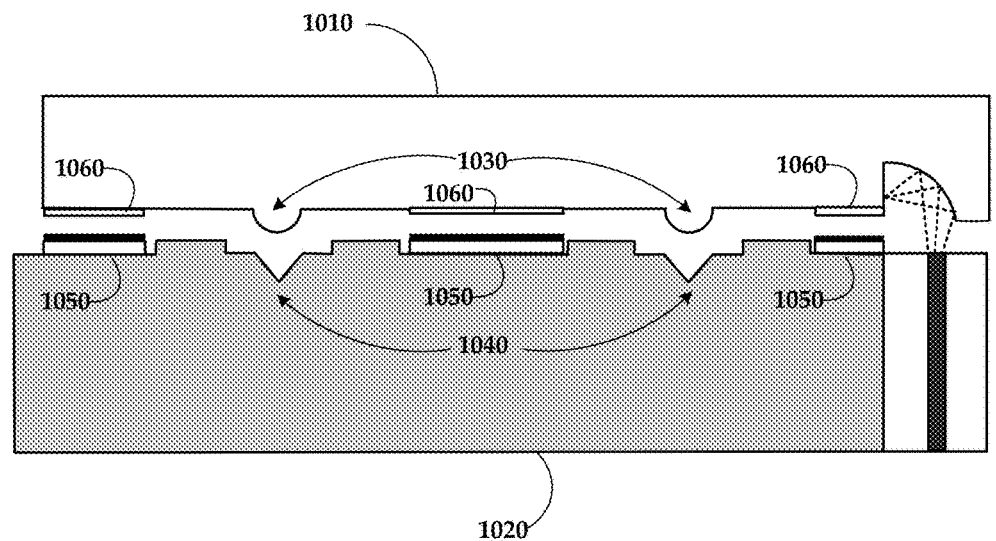
FIGS. 10A and 10B illustrate an alignment system for a HCSEL and a slider using features positioned on one or both of the HCSEL and the slider that help guide the HCSEL into a desired position in accordance with various embodiments described herein.
Figure 10B:
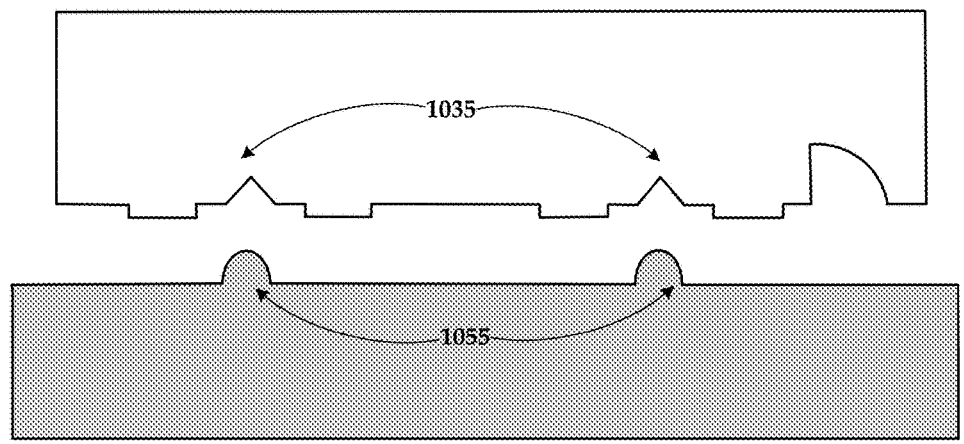

According to various embodiments, different methods may be used for downtrack, crosstrack and/or vertical alignment. FIGS. 10A and 10B illustrate an alignment system for a HCSEL and a slider using features positioned on one or both of the HCSEL and the slider that help guide the HCSEL into a desired position. FIG. 10A illustrates a HCSEL 1010 having multiple ball-type features 1030. While FIG. 10A illustrates the alignment features and/or protrusions on the HCSEL having rounded edges, it is to be understood that the alignment features 1030 may have any shape. These features are designed to aid in self alignment by fitting into corresponding recessions 1040 in the surface of the slider 1020 facing the HCSEL 1010. The shape of the features 1030 and/or the recessions 1040 may be designed to guide the HCSEL 1010 into a desired position with respect to the slider 1020. While FIG. 10A shows the recessions 1040 disposed on the slider 1020 as having a different shape than the features on the HCSEL 1010, it is to be understood that the features and the recessions may have similar, but opposite shapes such that the features fit substantially perfectly into the recessions. In some, cases, the difference in the shape of the features and the recessions allows for more accurate alignment than if the shapes were complementary shapes. Bond pads 1050, 1060 are disposed on one or both of the HCSEL 1010 and the slider 1020.

FIG. 10B illustrates an example system in which the alignment features 1055 are on the slider and the corresponding recessions 1035 are located on the HCSEL. In some cases, the features and recession shown in FIGS. 10A and 10B can be used in combination or alone as a coarse adjustment and then a solder reflow process may be used to provide a finer alignment. The features and recessions described in FIGS. 10A and 10B may be used in addition to or as an alternative to any of the other alignment methods described in this disclosure. While FIGS. 10A and 10B illustrate a system having triangular recessions, it is to be understood that the recessions can have any shape including three dimensional shapes. For example, the recessions can comprise have square shapes, slots, v-grooves, and/or tetrahedral shapes. In some cases, there is more than one shape for the protrusions and/or the recessions in a single system.

To obtain the rounded "ball"-type shapes 1055 in the slider or 1030 in the laser, one can use methods involving photoresist reflow to create a rounded profile (as the etch mask is uniformly removed, the rounded shape of the photomask is etched into the substrate underneath). The triangular grooves in the slider 1040 or laser 1035 can be formed by various wet or dry etching methods.

The number of alignment features can be defined by three holes to kinematically define the plane and rotation of the laser. Additional alignment holes (e.g. four instead of three) are theoretically redundant to define the alignment plane and rotation, but may be utilized to allow for fabrication tolerances.

Figure 11A:
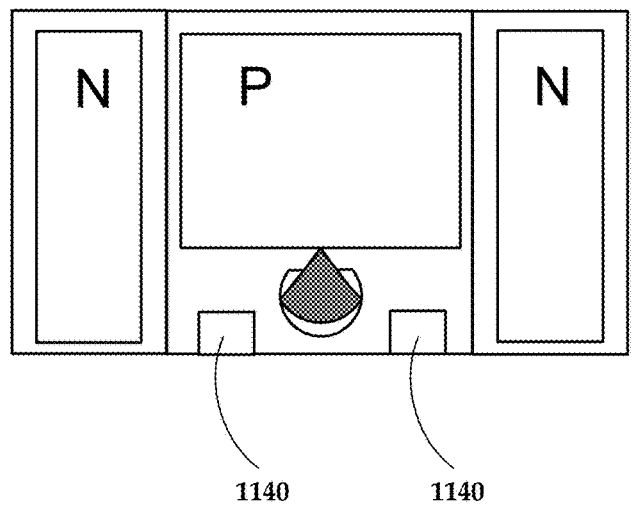
FIG. 11A shows reference posts 1140 that can be fabricated outside of the HCSEL and/or mirror region in a position that coincides with where various reference features are located in accordance with various embodiments described herein.

According to various embodiments described herein, protruding features such as posts can be etched or deposited as the HCSEL laser is processed at the wafer level. Features created on the HCSEL during processing using a wafer-level lithography method can achieve sub-micron alignment between the features on the HCSEL. The features on the HCSEL may include one or more of bond pads, self-alignment pads, an output facet, and/or an etched shaping mirror. FIG. 11A shows reference posts 1140 that can be fabricated outside of the HCSEL and/or mirror region in a position that coincides with where various reference features are located.

Figure 11B:
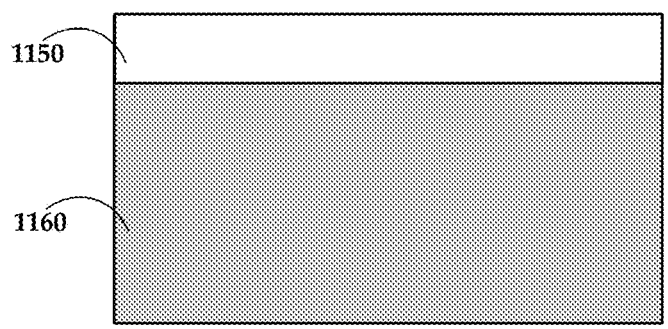
FIGS. 11B-11D illustrate the process for creating reference posts 1140 on the HCSEL surface in accordance with various embodiments described herein.
Figure 11C:
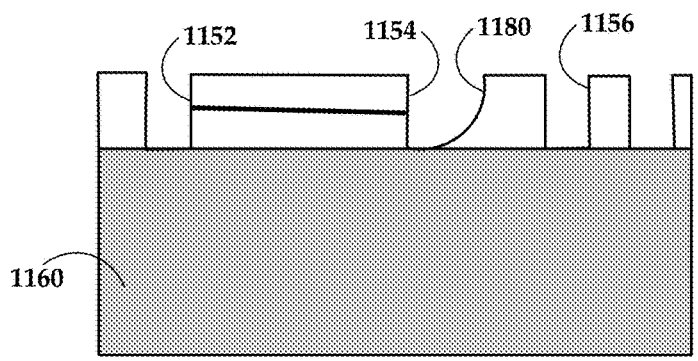
Figure 11D:
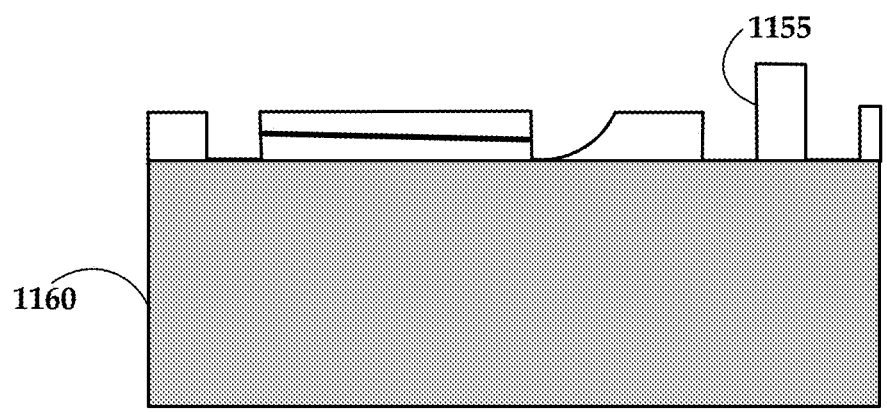
Figure 11E:
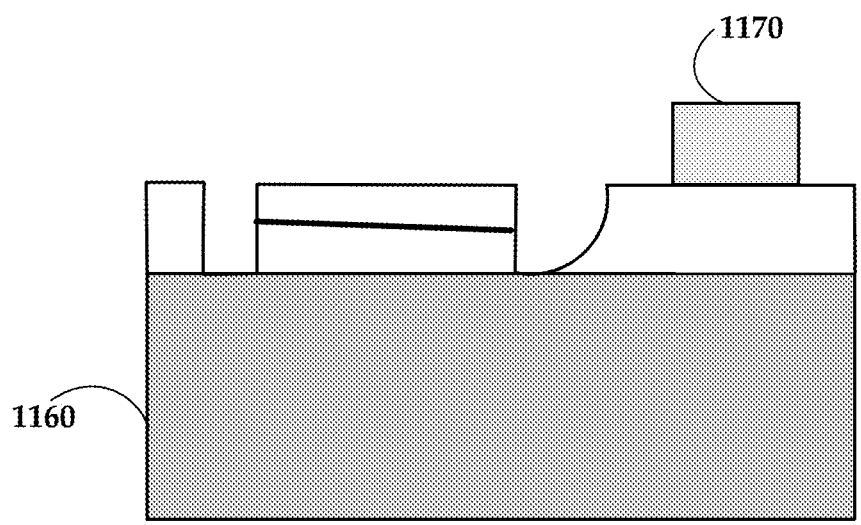
FIG. 11E illustrates a process for creating reference posts on the HCSEL surface in accordance with various embodiments described herein.

FIGS. 11B-11D illustrate the process for creating reference posts 1140 on the HCSEL surface. Device layers 1150 are fabricated on a substrate 1160. The device layers may include cladding, optical coupler, core layers and/or other read/write layers. According to various implementations, the substrate 1160 comprises AlTiC. In this example, the reference features are etched at the same time as the other features of the laser. For example, the alignment post 1156 is created at the same time as the rear facet 1152, the front facet 1154, and the shaped mirror 1180. According to various embodiments, features of the HCSEL except for the alignment post are etched to leave the protruding alignment post 1155. This selective etching process may be done by using various sacrificial layers and/or masks as described in conjunction with earlier figures. In some cases, the alignment post is deposited after or during the formation of other laser features as shown in FIG. 11E. In this case, the alignment post 1170 is deposited on top of the other laser features after or during fabrication of the other laser features.

Figure 12A:
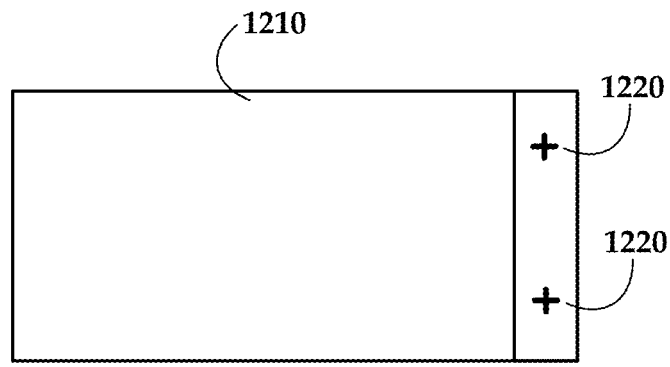
FIGS. 12A and 12B show an example in which fiducial marks are used to align the HCSEL to the optical input coupler in accordance with various embodiments described herein.
Figure 12B:
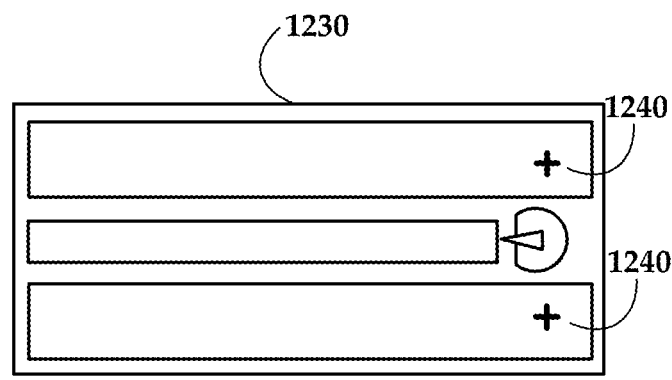

In accordance with various embodiments fiducial marks on the HCSEL and/or the slider are used to align various components. FIGS. 12A and 12B show an example in which fiducial marks are used to align the HCSEL to the optical input coupler. The fiducial marks can be patterned on the HCSEL and/or the slider at any time during the fabrication process. After fabrication and processing of the slider, the fiducial marks 1220 are exposed on the top side of the slider 1210 that faces the HCSEL as shown in FIG. 12A. Matching openings 1240 are exposed on the HCSEL 1230 on the side of the HCSEL 1240 facing the slider 1210. While FIGS. 12A and 12B show that the fiducial marks and the corresponding openings are crosses, it is to be understood that the fiducial marks can have any shape. An infrared camera can be used to align the fiducial marks with the corresponding openings on the HCSEL. During the alignment process, the fiducial mark appears transparent on the infrared camera and the surrounding area appears opaque. This allows direct alignment of the HCSEL with the slider through infrared imaging of the laser.

As described above, self-alignment pads have been may be used to provide alignment between the various features of the slider and the laser. The surface tension in reflowing solder that is in contact with two bond pads is used to guide alignment. In some cases, a greater number of alignment pads increases the surface area and thus results in better alignment precision. Various factors may be considered when designing an alignment system. For example, one or more of the following factors may be considered (1) providing enough surface area for precise self-alignment, (2) providing large enough pads to allow a coarse alignment of the laser (prior to self-alignment reflow), (3) providing good thermal cooling from the heat-generating laser cavity to the slider, and/or (4) providing electrical connection to the P and N electrodes on the laser and possibly to additional elements on the laser such as an integrated photodiode and/or a heater.

Figure 13A:
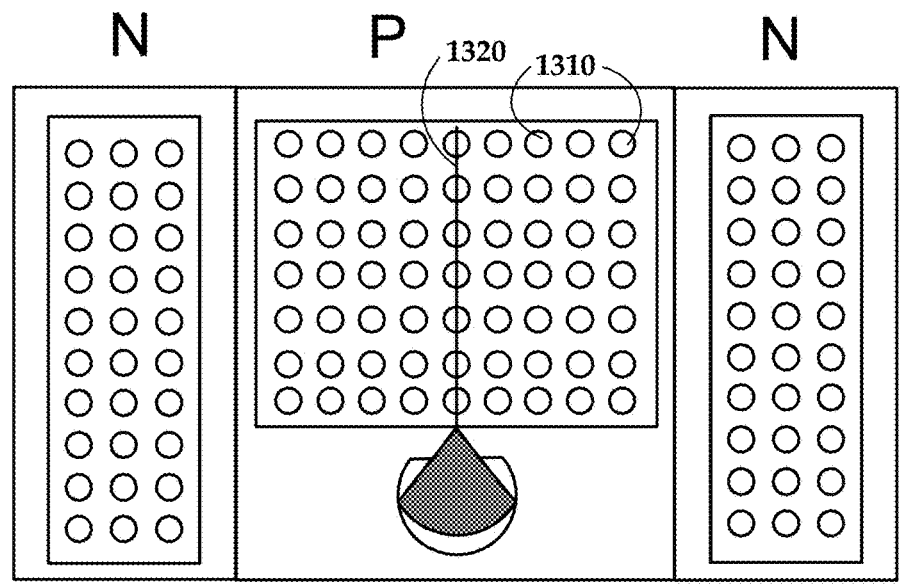
FIGS. 13A and 13B illustrates a solder pad configuration using an array of solder pads on the N and P electrodes in accordance with various embodiments described herein.
Figure 13B:
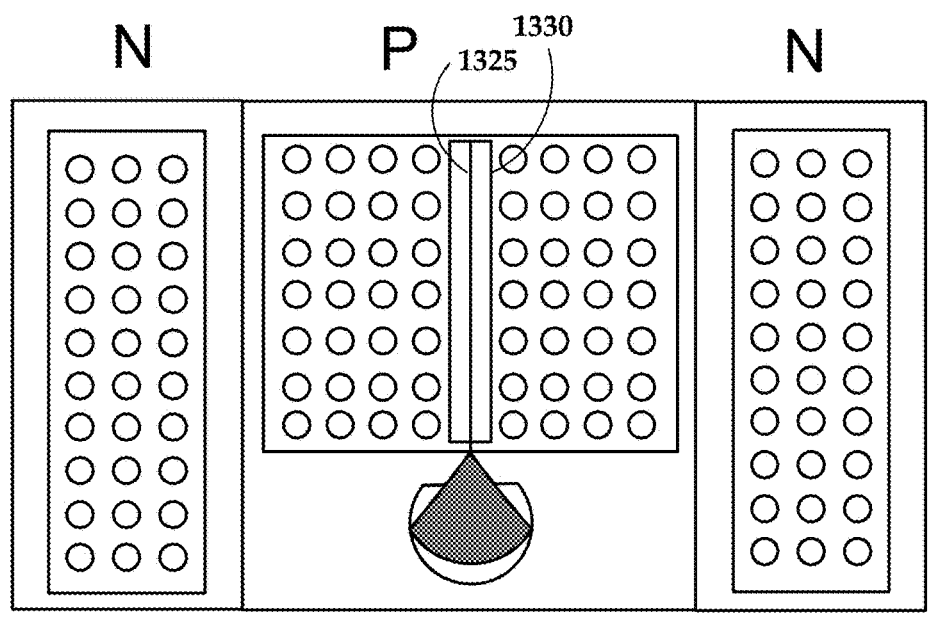

FIG. 13A illustrates a solder pad configuration using an array of solder pads on the N and P electrodes. In this example, the solder pads fully cover the surface of the P and N electrodes. The laser cavity 1320 follows along in a substantially straight line along a column of the solder pads. FIG. 13B shows another configuration in which there is a continuous bond pad 1330 disposed beneath the laser cavity 1325. The continuous bond pad may provide more continuous cooling and or better electrical connection to the laser cavity 1325.

While the configurations shown in FIGS. 13A and 13B illustrated a substantially straight laser cavity, in some cases, the laser cavity may have a folded configuration. This can be done by using etched facets to create the laser cavity and align and/or integrate the laser cavity with and etched shaping mirror and/or alignment features. A folded cavity may be created by providing multiple reflecting surfaces that are etched to create the folded cavity. The increase in cavity length that the folded cavity provides may enable higher power with less reliability risk of self-heating. The folded cavity may also allow for a more compact design so that the HCSEL fits into the constraints of the application, e.g., a HAMR system. In a folded laser cavity, the laser cavity has at least one bend and may include a series of bends. The laser cavity is uniformly cooled below the laser cavity shape.

Figure 14A:
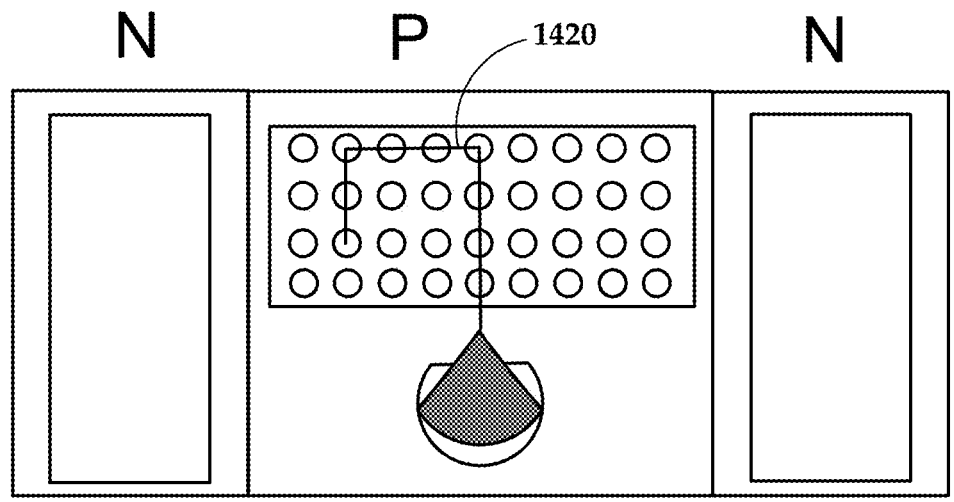
FIGS. 14A-14F illustrate laser systems having folded cavities and associated solder embodiments to enable thermal conduction and self-alignment in accordance with various embodiments described herein.
Figure 14B:
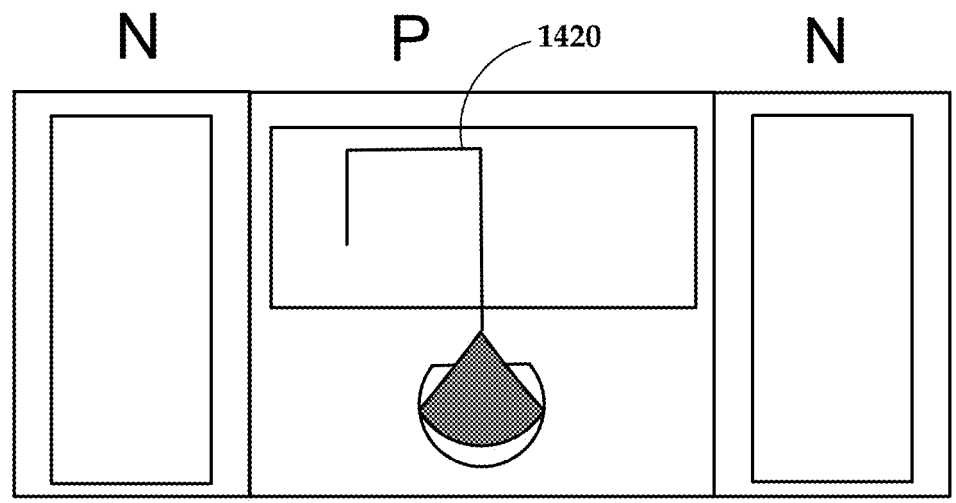
Figure 14C:
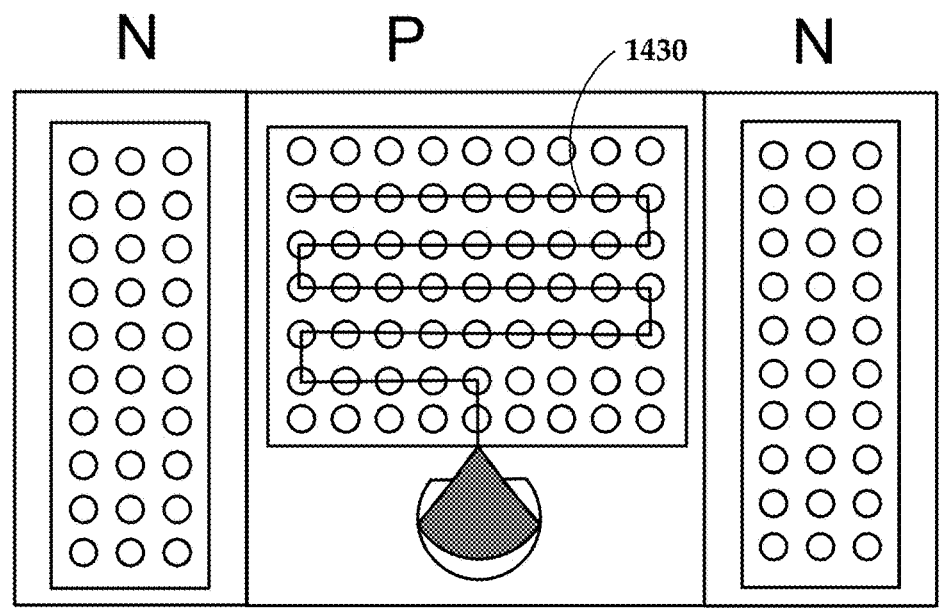
Figure 14D:
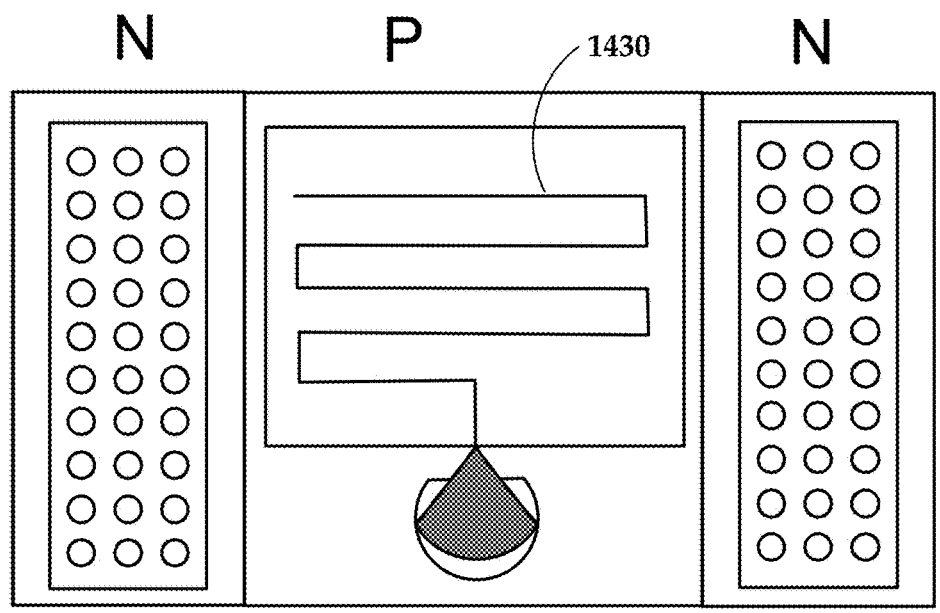
Figure 14E:
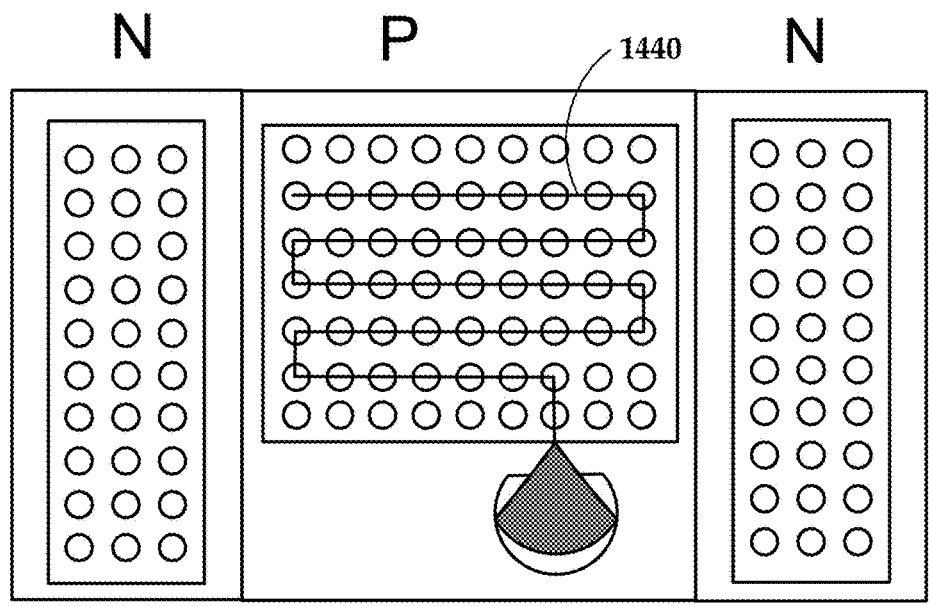
Figure 14F:
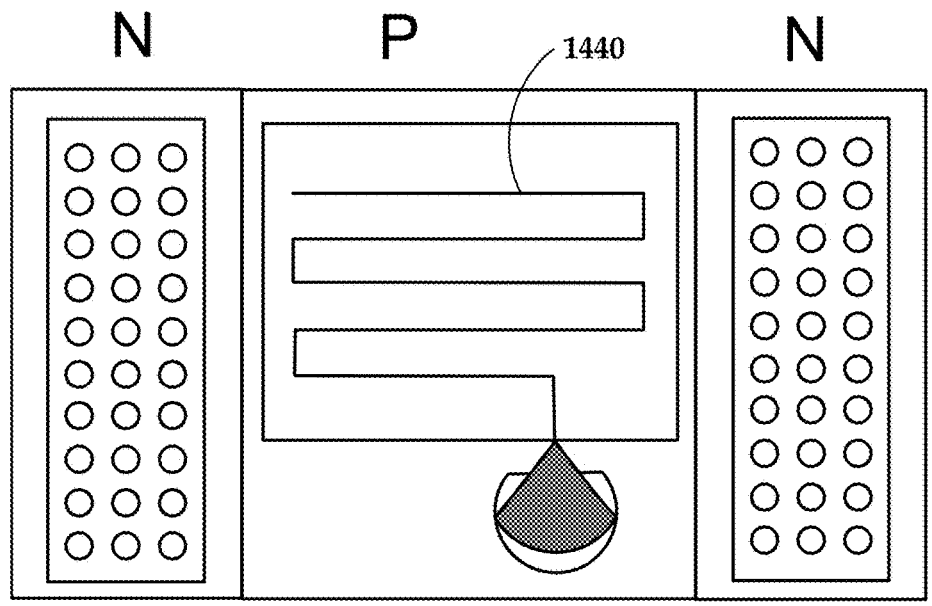

FIGS. 14A-14E illustrate laser systems having folded cavities. In FIGS. 14A and 14B, the laser cavity length is the same size as the cavity length illustrated in FIGS. 13A, and 13B, but the laser is shorter so the cavity is folded to accommodate the laser length. While the example shown in FIG. 14A shows a laser cavity having two bends, it is to be understood that the folded laser cavity can have more or fewer bends. Similarly as in FIGS. 13A and 13B, solder pads are located on substantially the entire surface of the P and N electrodes. FIG. 14B shows the folded laser cavity of FIG. 14A without the solder pads for a better view of the cavity. FIGS. 14C and 14D show another example of a folded laser cavity with a similarly sized laser as in FIGS. 13A in 13B. In this case, the laser cavity 1430 has a series of bends. FIGS. 14E and 14F illustrate another example of a folded laser cavity 1440 where the emission output is offset with respect to the electrode. In some cases, the folded lasing cavity comprises at least one curve.

While FIGS. 13A-14F illustrate circular solder pads, it is to be understood that the solder pads can be any shape. For example, the solder pads can have a square or a triangular shape, for example. In some cases, the solder pads are not a uniform size and/or shape such that the size and/or shape varies between different solder pads. For example, the solder pads on the P electrode may be a different size and/or shape than solder pads on the N electrodes. In some embodiments, the solder pads do not cover the entire surface of the P and/or N electrodes. For example, the solder pads may cover only a portion of the P and/or N electrodes. In some cases, the solder pads may only be present underneath the laser stripe.

According to various implementations, contamination in the optical path or on the laser surface can lead to laser failures on the output facet or blockage of the optical path between the laser emission and optical coupler input. FIGS. 15A-15D illustrate using bonding material to create complete or partial sealing rings and/or mechanical filters that prevent mechanical particles and/or liquids from coming into the laser emission, laser shaping mirror, and/or coupler space.

Figure 15A:
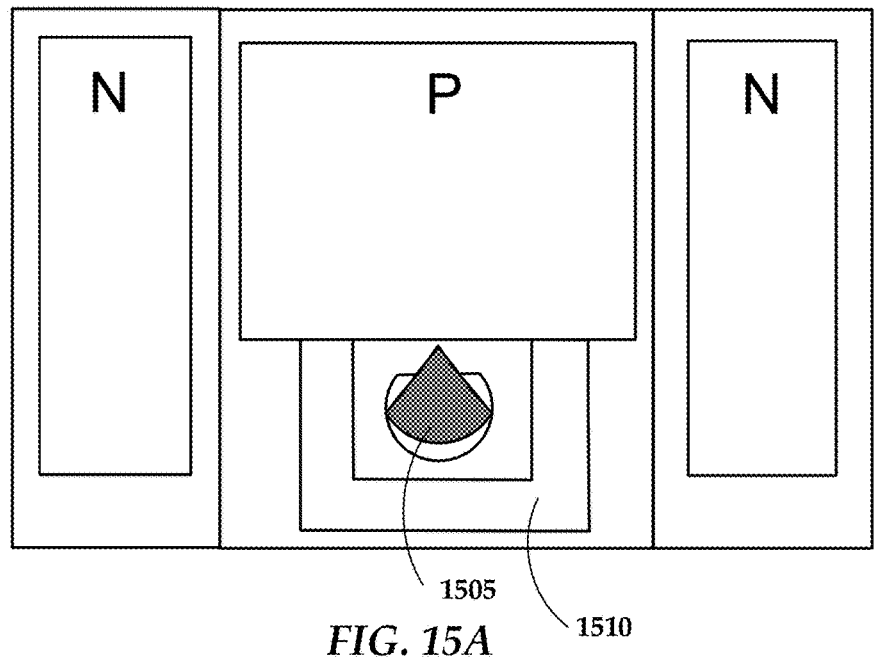
FIGS. 15A-15D illustrate using bonding material to create complete or partial sealing rings and/or mechanical filters that prevent mechanical particles and/or liquids from coming into the laser emission, laser shaping mirror, and/or coupler space cavities in accordance with various embodiments described herein.
Figure 15B:
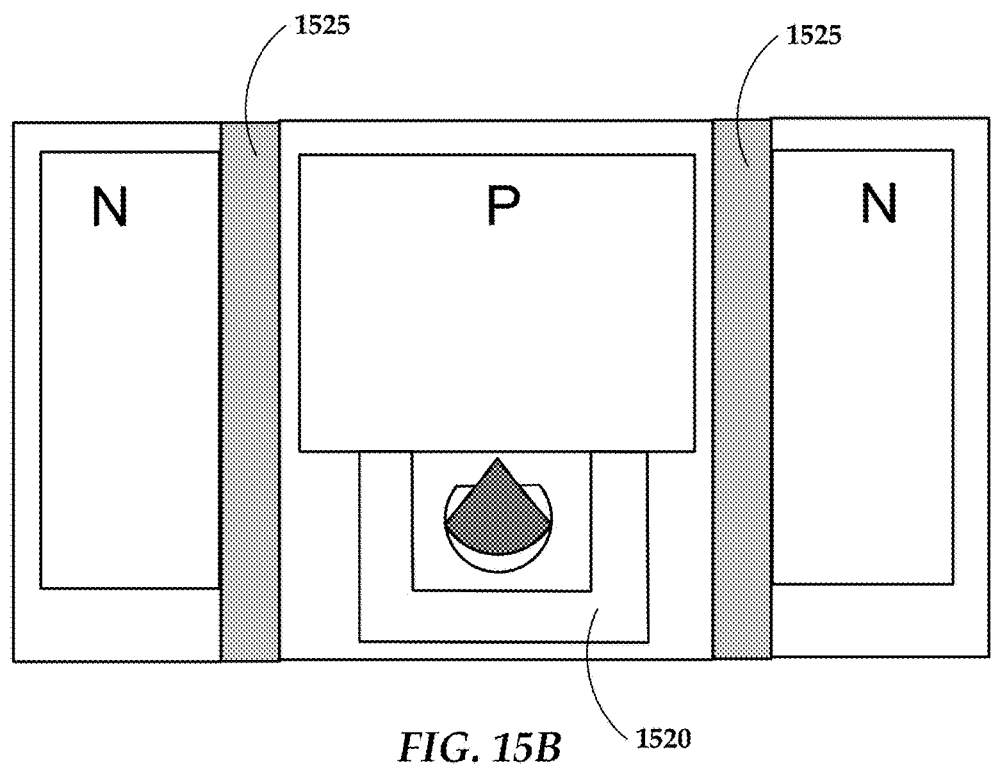
Figure 15C:
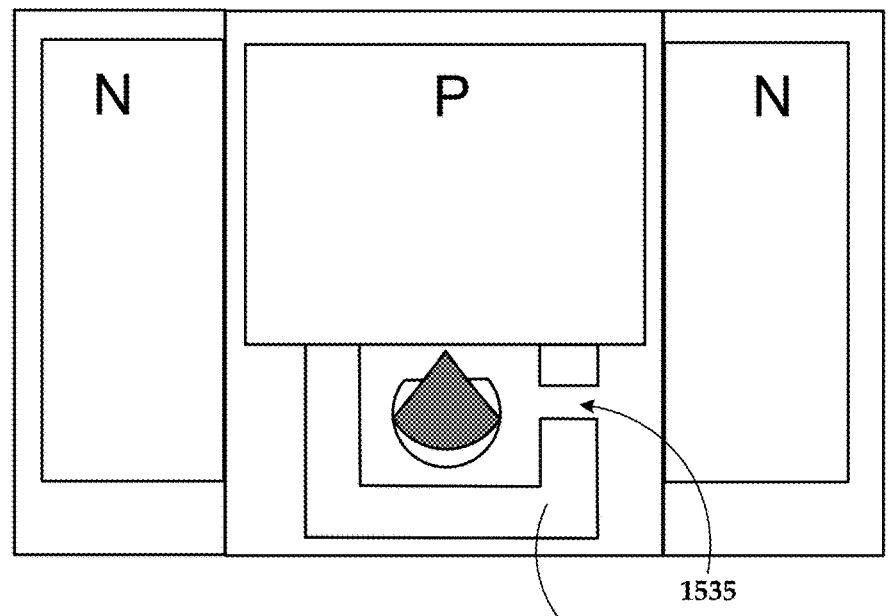
Figure 15D:
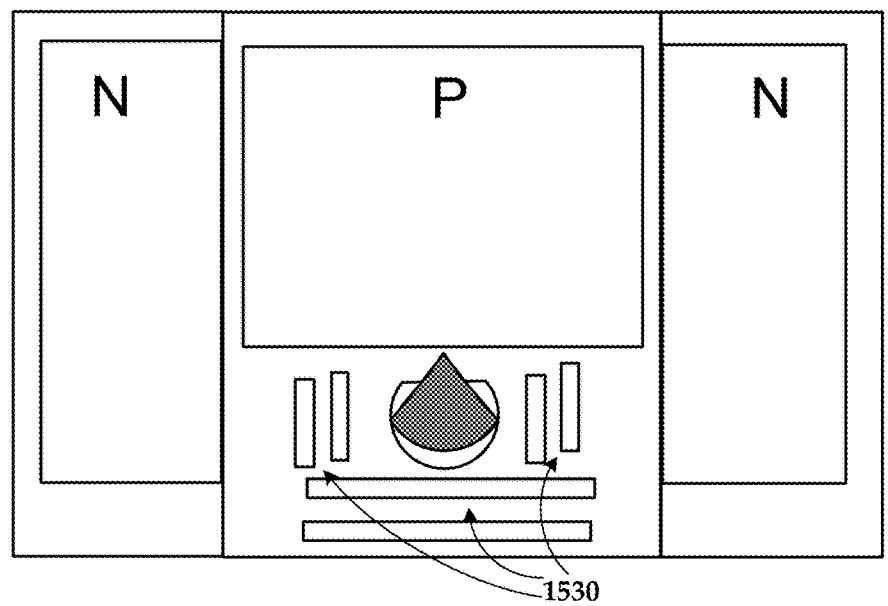

FIG. 15A shows a completely closed sealing barrier 1510 around the laser emission and mirror area 1505. The sealing barrier may be formed using a bonding material. For example, the bonding material used may be the same bonding material that is disposed between the pads as described above. The bonding material may completely surround the laser emission and mirror area 1505 and a sealing material may be used to provide an airtight seal. In some cases, the bonding material and/or the sealing material comprises solder. In some cases, a sealing material is not used allowing some airflow and preventing pressure build-up. According to various implementations, the height of the N and P contacts is offset such that the P contact is higher than one or both of the P contacts. In some cases, the N and P contacts are at substantially the same height. In some cases, a ridge 1525 is formed between the N and P contacts facilitating a same or similar height of the N and P contacts as shown in FIG. 15B. FIG. 15C illustrates an example in which the sealing ring 1530 is not sealed and an opening 1535 is provided. The opening 1535 may be configured to prevent pressure build up from the thermal heat up during the laser operation. FIG. 15D shows another configuration in which a series of mechanical barriers are used to act as a mechanical filter preventing particles from reaching the laser area. In all of the cases of FIGS. 15A-15D the mechanical barriers may or may not be bonded to the slider. These may or may not be directly bonded to the head.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A laser comprising:
a folded lasing cavity comprising at least one bend, the folded lasing cavity disposed on and configured to emit light along a substrate-parallel plane;
an etched facet on an emitting end of the folded lasing cavity and an etched mirror on another end of the folded lasing cavity; and
an etched shaping mirror that redirects light received from the etched facet in a direction normal to the substrate-parallel plane, wherein the folded lasing cavity is uniformly cooled below the folded lasing cavity.

2. The laser of claim 1, further comprising a grid of electrically conductive bumps on one side of the laser, a first portion of the bumps positioned over and coupled to the folded lasing cavity being configured as anode connections and a second portion of the bumps not positioned over the folded lasing cavity being configured as cathode connections.

3. The laser of claim 2, wherein the electrically conductive bumps are configured to provide alignment of the laser with an optical input coupler of a slider.

4. The laser of claim 2, wherein the etched shaping mirror is substantially centered with respect to the first portion of the bumps.

5. The laser of claim 2, wherein the etched shaping mirror is offset with respect to the first portion of the bumps.

6. The laser of claim 1, wherein the folded lasing cavity is formed by using etched reflective surfaces to direct the light.

7. The laser of claim 1, wherein the folded lasing cavity comprises three or more bends such that at least two portions of the folding cavity laser are aligned and parallel with one another.

8. The laser of claim 1, wherein at least one of the at least one bends is a right angle.

9. The laser of claim 1, wherein at least one of the at least one bends comprises a curve.

\* \* \* \* \*